(12) United States Patent
Zhang et al.

(10) Patent No.: US 11,721,516 B2
(45) Date of Patent: Aug. 8, 2023

(54) EMITTER, ELECTRON GUN USING SAME, AND ELECTRONIC DEVICE

(71) Applicant: National Institute for Materials Science, Tsukuba (JP)

(72) Inventors: Han Zhang, Tsukuba (JP); Jie Tang, Tsukuba (JP); Daisuke Fujita, Tsukuba (JP); Yasushi Yamauchi, Tsukuba (JP); Luchang Qin, Tsukuba (JP)

(73) Assignee: National Institute for Materials Science, Tsukuba (JP)

( * ) Notice: Subject to any disclaimer, the term of this patent is extended or adjusted under 35 U.S.C. 154(b) by 190 days.

(21) Appl. No.: 17/423,149

(22) PCT Filed: Jan. 6, 2020

(86) PCT No.: PCT/JP2020/000027
§ 371 (c)(1),
(2) Date: Jul. 15, 2021

(87) PCT Pub. No.: WO2020/158297
PCT Pub. Date: Aug. 6, 2020

(65) Prior Publication Data
US 2022/0130634 A1    Apr. 28, 2022

(30) Foreign Application Priority Data
Jan. 30, 2019  (JP) ................. 2019-013714

(51) Int. Cl.
*H01J 37/073*    (2006.01)
*H01J 9/12*    (2006.01)
*H01J 37/063*    (2006.01)

(52) U.S. Cl.
CPC .............. *H01J 37/073* (2013.01); *H01J 9/12* (2013.01); *H01J 37/063* (2013.01)

(58) Field of Classification Search
CPC .. H01J 9/12; H01J 37/06; H01J 37/063; H01J 37/073; H01J 2237/063; H01J 2237/06325; H01J 2237/06341; H01J 1/3044
See application file for complete search history.

(56) References Cited

U.S. PATENT DOCUMENTS

2004/0026629 A1* 2/2004 Fujieda ............ B82Y 10/00
                                                                  250/306
2008/0067407 A1    3/2008 Fujieda et al.
(Continued)

FOREIGN PATENT DOCUMENTS

JP     04017247 A  *  1/1992
JP     H04-17247 A    1/1992
(Continued)

OTHER PUBLICATIONS

Extended European Search Report dated Sep. 12, 2022, issued in corresponding European Patent Application No. 20748838.8.
(Continued)

*Primary Examiner* — David E Smith
(74) *Attorney, Agent, or Firm* — Morgan, Lewis & Bockius LLP (57) ABSTRACT

The purpose of the present invention is to provide an emitter capable of easily and highly efficiently emitting electrons, an electron gun using same, and an electronic device.
This emitter is provided with a cathode holder, and an acicular substance secured to the cathode holder. An end, to which the acicular substance is secured, of the cathode holder is bent at α (α(°) satisfies 5<α≤70) that is an angle formed with respect to a cathode axis being the longitudinal direction of the cathode holder, the acicular substance is a single crystal nanowire or nanotube, and a relation L/T between the thickness T (μm) of the end of the cathode
(Continued)

holder and a length L (μm) by which the acicular substance protrudes from the end satisfies $0.3 \leq L/T \leq 2.5$.

19 Claims, 7 Drawing Sheets

(56) References Cited

U.S. PATENT DOCUMENTS

| | | | |
|---|---|---|---|
| 2013/0049568 A1 | 2/2013 | Nonogaki et al. | |
| 2018/0019091 A1 | 1/2018 | Tang et al. | |

FOREIGN PATENT DOCUMENTS

| | | | | |
|---|---|---|---|---|
| JP | 2005-063802 A | 3/2005 | | |
| JP | 2005-243389 A | 9/2005 | | |
| JP | 2006-031976 A | 2/2006 | | |
| JP | 2006031976 A | * | 2/2006 | |
| JP | 2007-287401 A | 11/2007 | | |
| JP | 2008-262794 A | 10/2008 | | |
| JP | 2009-026710 A | 2/2009 | | |
| JP | 2011-238459 A | 11/2011 | | |
| JP | 2016-110748 A | 6/2016 | | |
| JP | 2016/140177 A1 | 9/2016 | | |
| WO | 2010/123007 A1 | 10/2010 | | |
| WO | WO-2010123007 A1 | * | 10/2010 | ............ H01J 1/3044 |

OTHER PUBLICATIONS

International Search Report issued in corresponding International Patent Application No. PCT/JP2020/000027 dated Mar. 17, 2020.
International Preliminary Report on Patentability and Written Opinion issued in corresponding International Patent Application No. PCT/JP2020/000027 dated Jul. 27, 2021.

* cited by examiner

EMITTER, ELECTRON GUN USING SAME, AND ELECTRONIC DEVICE

TECHNICAL FIELD

The present invention relates to an emitter, an electron gun using the emitter, and an electronic device.

BACKGROUND ART

In order to obtain a high-resolution and high-brightness observation image, a sharpened needle-like electrode is used as an ion source or an electron source in an electron gun or a focused ion beam device in an electron microscope, and various improvements have been made.

A light source (i.e., ion source) of a focused ion beam device using an inexpensive polycrystalline tungsten emitter is known (see, e.g., Patent Literature 1). Patent Literature 1 discloses that a high-brightness beam is emitted by bending (see FIG. 5(A) of Patent Literature 1) and tilting (see FIG. 5(B) of Patent Literature 1) a tip of a polycrystalline tungsten wire by 35 degrees, or bending a body part of the polycrystalline tungsten wire (see FIG. 1 of Patent Literature 1).

In addition, an electron source using a tungsten single crystal is known (see, e.g., Patent Literature 2). The electron source of Patent Literature 2 is made of a tungsten single crystal having crystal direction of <100> coated with ZrO, and discloses that the angle formed by the direction of the axis of the cathode of the tungsten single crystal and the crystal direction of <100> is adjusted to 22.5±10°. As a result, electrons emitted from the vicinity of the boundary between the (110) plane and the (110) plane at the tip of the tungsten single crystal are emitted substantially parallel to the axis of the cathode.

In addition, an electron source using a carbon nanotube is known (see, e.g., Patent Literature 3). According to Patent Literature 3, it is disclosed that a nanotube is arranged within an angular range of 30 degrees to the left and right, centered on the orthogonal direction of the tip edge of the cathode holder. As a result, the electron beam which is field-emitted from the tip of the nanotube can be converged with high efficiency.

However, according to Patent Literatures 1 to 3, in the case of using a tungsten polycrystal, a tungsten single crystal, or a carbon nanotube as an electron source, the sizes thereof are from the nano order to the micro order, and bending or tilting the electron source at a predetermined angle is extremely complicated and requires high accuracy. Therefore, development of an emitter capable of easily and highly efficiently emitting electrons is desired.

CITATION LIST

Patent Literature

PATENT LITERATURE 1: JPH 04-17247 A
PATENT LITERATURE 2: JP 2011-238459 A
PATENT LITERATURE 3: JP 2005-243389 A

SUMMARY OF INVENTION

Technical Problem

An object of the present invention is to provide an emitter capable of easily and highly efficiently emitting electrons, an electron gun and an electronic device using the same.

Solution To Problem

In an emitter according to the present invention wherein the emitter includes a cathode holder and a needle-like substance fixed to an end of the cathode holder, the end of the cathode holder to which the needle-like substance is fixed is bent at an angle $\alpha$ (wherein $\alpha$ (unit: °) satisfies $5°<\alpha\leq70°$ formed with respect to the cathode axis which is the longitudinal direction of the cathode holder, the needle-like substance is a single crystal nanowire or a nanotube, and a relation L/T between a thickness T (unit: μm) of the end of the cathode holder and a length L (unit: μm) by which the needle-like substance protrudes from the end of the cathode holder satisfies $0.3\leq L/T\leq 2.5$. As a result, the above problem is solved.

The angle $\alpha$ (unit: °) may satisfy $10°\leq\alpha\leq 40°$, and the relation L/T may satisfy $0.5\leq L/T\leq 2.5$.

The angle $\alpha$ (unit: °) may satisfy $10°\leq\alpha\leq 15°$.

An angle $\theta$ (unit: °) formed by a direction of the cathode axis and a direction in which the end of the needle-like substance emits electrons may satisfy $0°\leq\theta<4°$.

The angle $\theta$ (unit: °) may satisfy $0°\leq\theta\leq 3°$.

The needle-like substance may have a diameter in a range of 1 nm or more and 200 nm or less and a length in a range of 500 nm or more and 30 μm or less.

The single crystal nanowire may be at least one selected from the group consisting of a rare earth boride, a metal carbide, and a metal oxide.

The single crystal nanowire is the rare earth boride that is $LaB_6$, and a longitudinal direction of the single crystal nanowire matches the <100> crystal direction, and an end of the single crystal nanowire through which electrons are to be emitted may have at least a {100} plane, a {110} plane, and a {111} plane.

The single crystal nanowire is a metal carbide that is HfC, and a longitudinal direction of the single crystal nanowire matches to the <100> crystal direction, and an end of the single crystal nanowire through which electrons are to be emitted may have at least a {111} plane and a {110} plane.

The nanotube may be any one selected from the group consisting of a carbon nanotube, a boron nitride nanotube, and a boron carbonitride nanotube.

A distance d (unit: μm) between the cathode axis and an end of the needle-like substance that emits electrons may satisfy $5 \mu m\leq d\leq 50 \mu m$.

The distance d (unit: μm) may satisfy $6 \mu m\leq d\leq 40 \mu m$.

The end of the needle-like substance that emits electrons may have a tapered shape.

The cathode holder may be made of any metal selected from tantalum (Ta), tungsten (W), and rhenium (Re).

An electron gun according to the present invention includes an electrode, a filament connected to the electrode, and the emitter according to any one of the above attached to the filament. As a result, the above problem is solved.

The filament may be made of any metal selected from the group consisting of tungsten (W), tantalum (Ta), platinum (Pt), rhenium (Re), and carbon (C).

The electron gun may be a cold cathode field emission electron gun or a Schottky electron gun.

In an electronic device including an electron gun according to the present invention, the electron gun is the electron gun according to any one of the above. As a result, the above problem is solved.

The electronic device may be selected from the group consisting of a scanning electron microscope, a transmission electron microscope, a scanning transmission electron microscope, an Auger electron spectrometer, an electron energy loss spectrometer, and an energy dispersive electron spectrometer.

Advantageous Effects of Invention

An emitter of the present invention includes a cathode holder and a needle-like substance fixed to an end of the cathode holder, the end of the cathode holder to which the needle-like substance is fixed is bent at an angle α (wherein α (unit: °) satisfies 5°<α≤70°) formed with respect to a cathode axis which is a longitudinal direction of the cathode holder. Also, the needle-like substance is a single crystal nanowire or a nanotube, but known nanowires or nanotubes which are already available can be used there. As described above, since the emitter according to the present invention has only to fix the needle-like substance to the end, it is not necessary to adjust the angle of the end of the needle-like substance itself from which electrons are emitted. Furthermore, according to the emitter of the present invention, since the relation L/T between the thickness T (unit: μm) of the end of the cathode holder and the length L (unit: μm) by which the needle-like substance protrudes from the end of the cathode holder satisfies 0.3≤L/T≤2.5, the direction of an electron emitted from the emitter is substantially parallel to the cathode axis and stable. Therefore, the electron beam can be converged with high efficiency.

Such an emitter can be employed in an electron gun and an electronic device such as a scanning electron microscope, a transmission electron microscope, a scanning transmission electron microscope, an Auger electron spectrometer, an electron energy loss spectrometer, or an energy dispersive electron spectrometer using the electron gun.

DESCRIPTION OF EMBODIMENTS

Hereinafter, Embodiments of the present invention are described with reference to the drawings. It is also to be noted that a similar element is denoted by a similar reference numeral, and description thereof is omitted.

Embodiment 1

Embodiment 1 describes an emitter of the present invention and a method for manufacturing the emitter.

Figure 1:
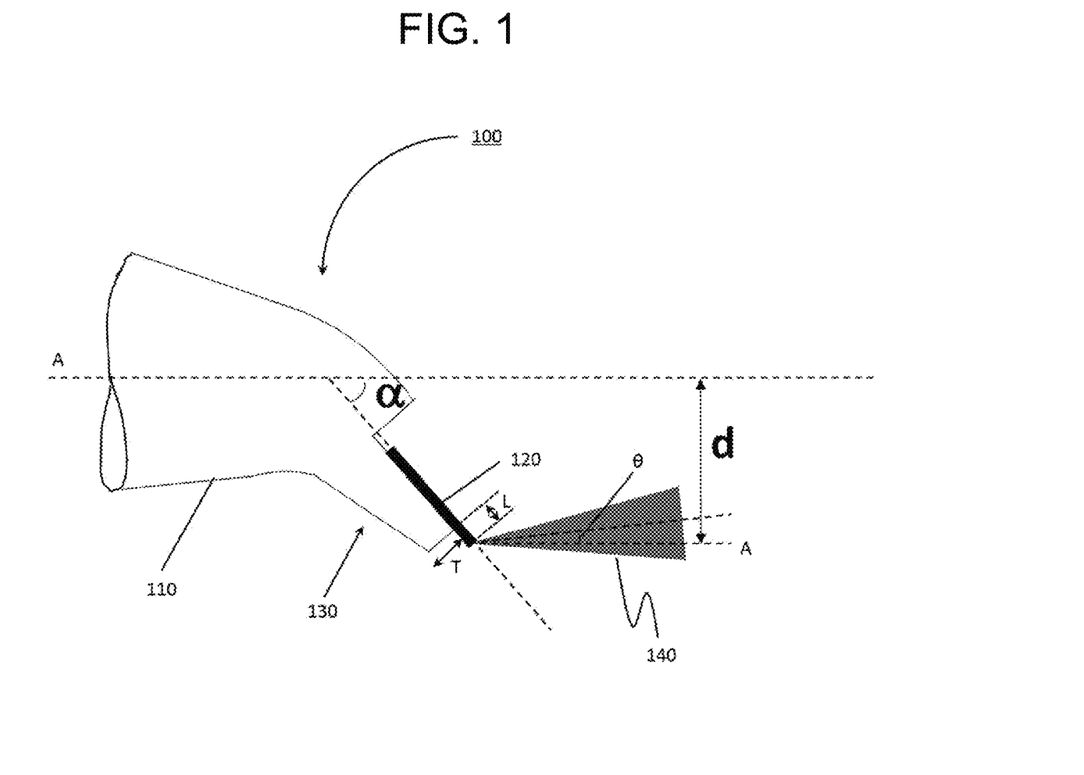
FIG. 1 is a schematic view showing an emitter of the present invention.

FIG. 1 is a schematic view of an emitter according to Embodiment 1.

An emitter 100 of the present invention includes a cathode holder 110 and a needle-like substance 120 fixed to the cathode holder 110. An end 130 of the cathode holder 110 to which the needle-like substance 120 is fixed has a simple configuration in which the end 130 is bent at an angle α (wherein α (unit: °) satisfies 5°<α≤70°) formed with respect to a cathode axis A which is a longitudinal direction of the cathode holder 110 (wherein the longitudinal direction is the same as the horizontal direction with respect to the paper surface of FIG. 1). Although the needle-like substance 120 is a single crystal nanowire or a nanotube, its implementation is easy because it is not necessary to adjust the angle of the end from which electrons are emitted. Furthermore, the inventors of the present application have found that the direction of an electron 140 emitted from the needle-like substance 120 can be made substantially parallel to the cathode axis A and the electron beam can be highly efficiently converged by fixing the needle-like substance 120 to the cathode holder 110 such that the above angle α satisfies the above range and the relation L/T between a thickness T (unit: μm) of the end 130 of the cathode holder 110 and a length L (unit: μm) by which the needle-like substance 120 protrudes from the end 130 satisfies 0.3≤L/T≤2.5.

The cathode holder 110 is not particularly limited as long as it is a conductive material, but is preferably any metal material selected from the group consisting of tantalum (Ta), tungsten (W), and rhenium (Re). These materials are excellent in processability.

The needle-like substance 120 preferably has a diameter in a range of 1 nm or more and 200 nm or less and a length in a range of 500 nm or more and 30 μm or less. Accordingly, the above relation L/T can be satisfied. In the present specification, when the needle-like substance 120 is a nanotube, the "diameter" means the outer diameter of the nanotube.

The material of the needle-like substance 120 is not particularly limited as long as it is a single crystal nanowire or a nanotube wherein the single crystal nanowire or the nanotube is capable of emitting electrons, but when the needle-like substance 120 is a single crystal nanowire, it is preferably made of any material selected from the group consisting of a rare earth boride, a metal carbide, and a metal oxide. Examples of the rare earth boride include lanthanum hexaboride ($LaB_6$), cerium hexaboride ($CeB_6$), and gadolinium hexaboride ($GdB_6$). Examples of the metal carbide include hafnium carbide (HfC), titanium carbide (TiC), tantalum carbide (TaC), and niobium carbide (NbC). Examples of the metal oxide include titanium oxide, tin oxide, and zinc oxide.

When the needle-like substance 120 is a single crystal nanowire made of a rare earth boride, $LaB_6$ is preferable. For example, as disclosed in JP 2008-262794 A, a method for manufacturing $LaB_6$ is known, and from this point of view, $LaB_6$ is easily available. $LaB_6$ is preferably processed such that its longitudinal direction matches the <100> crystal direction, and an end through which electrons are to be emitted has at least a {100} plane, a {110} plane, and a {111} plane. As a result, the electron 140 is emitted with high efficiency.

When the needle-like substance 120 is a single crystal nanowire made of the metal carbide, it is preferably HfC. For example, as disclosed in WO 2016-140177 A1, a method for manufacturing HfC is known, and from this point of view, HfC is easily available. HfC is preferably processed such that the longitudinal direction thereof corresponds to the <100> crystal direction, and an end through which electrons are to be emitted has at least a {110} plane and a {111} plane. As a result, the electron 140 is emitted with high efficiency.

It is to be noted that that the symbol <100> in the present specification intends all crystal directions equivalent to [100] from the viewpoint of point group symmetry. Similarly, It is to be noted that the symbol {100} in the present specification include surfaces each having equivalent symmetry.

When the needle-like substance 120 is a nanotube, it is preferably selected from the group consisting of a carbon nanotube, a boron nitride nanotube and a boron carbonitride nanotube. For example, the carbon nanotube may be any one of a single-walled carbon nanotube (SWNT), a double-walled carbon nanotube (DWNT), and a multi-walled carbon nanotube (MWNT).

As for the needle-like substance 120, the end that emits electrons may preferably have a tapered shape. As a result, electrons are emitted with higher efficiency.

As described above, the inventors of the present application have found, from various experiments described later, the following: the end 130 of the cathode holder 110 to which the needle-like substance 120 is fixed is bent at an angle α (wherein α (unit: °) satisfies 5°<α≤70°) formed with respect to the cathode axis A which is a longitudinal direction of the cathode holder 110 (wherein the longitudinal direction is the same as the horizontal direction with respect to the paper surface of FIG. 1), and the relation L/T between a thickness T (unit: μm) of the end 130 of the cathode holder 110 and a length L (unit: μm) by which the needle-like substance 120 protrudes from the end 130 satisfies 0.3≤L/T≤2.5, so that the direction of an electron emitted from the needle-like substance 120 can be substantially parallel to the cathode axis A. Specifically, as the angle α is smaller and the value of L/T is larger or as the angle α is larger and the value of L/T is smaller, the direction of the electron 140 emitted from the needle-like substance 120 can be substantially parallel to the cathode axis A, and thus the relation between the angle α and the value of L/T is important.

Here, in the present specification, "substantially parallel" means that an angle θ (unit: °) formed by the cathode axis A and the direction in which the end of the needle-like substance 120 emits electrons satisfies 0°≤θ≤4°. Depending on the adjustment of the angle α and the value of L/T, the angle θ (unit: °) may further satisfy 0°≤θ≤3°.

According to the emitter of the present invention, the direction of an electron emitted from the emitter is stable since the angle θ (unit: °) formed can satisfy the above range (specifically 0°≤θ<4°, preferably 0°≤θ≤3°, and the electron beam can be converged with high efficiency.

According to the emitter 100 of the present invention, since the needle-like substance 120 is located away from the cathode axis A, it is natural that electrons emitted from the end of the needle-like substance 120 are shifted from the cathode axis A. However, since the degree of the shift is 100 μm or less, the shift can be corrected with only a slight adjustment when an electronic device with the emitter 100 of the present invention attached to an electron gun is set up. A distance d (i.e., the shift from cathode axis A) between an end of the needle-like substance 120 from which electrons are emitted and the cathode axis A preferably satisfies 5≤d≤50.

However, it is preferable that the angle α (unit: °) satisfies 10°≤α≤40°, and the relation L/T satisfies 0.5≤L/T≤2.5, so that the distance d (i.e., the shift from the cathode axis A) between the end of the needle-like substance 120 from which electrons are emitted and the cathode axis A can be reduced. Specifically, the distance d (unit: μm) satisfies 6 μm≤d≤40 μm.

The angle α (unit: °) more preferably satisfies 10°≤α≤15°. As a result, the distance d (μm) can be suppressed to 6 μm≤d≤10 μm.

In the emitter 100 of the present invention, as described above, the lower limit value of the distance d (unit: μm) is preferably 5 (μm) and more preferably 6 (μm), and the upper limit value thereof is preferably 50 (μm), more preferably 40 (μm), and further more preferably 10 (μm) from the viewpoint of, for example, stabilizing the direction of an electron emitted from the emitter and converging the electron beam with high efficiency.

The emitter 100 of the present invention shows an aspect in which the cathode holder 110 is bent downward with respect to the paper surface of FIG. 1, but may be bent upward, toward the front side, or toward the back side with respect to the paper surface. In any case, the angle α, L/T, θ, and d satisfy the above relation.

Figure 2:
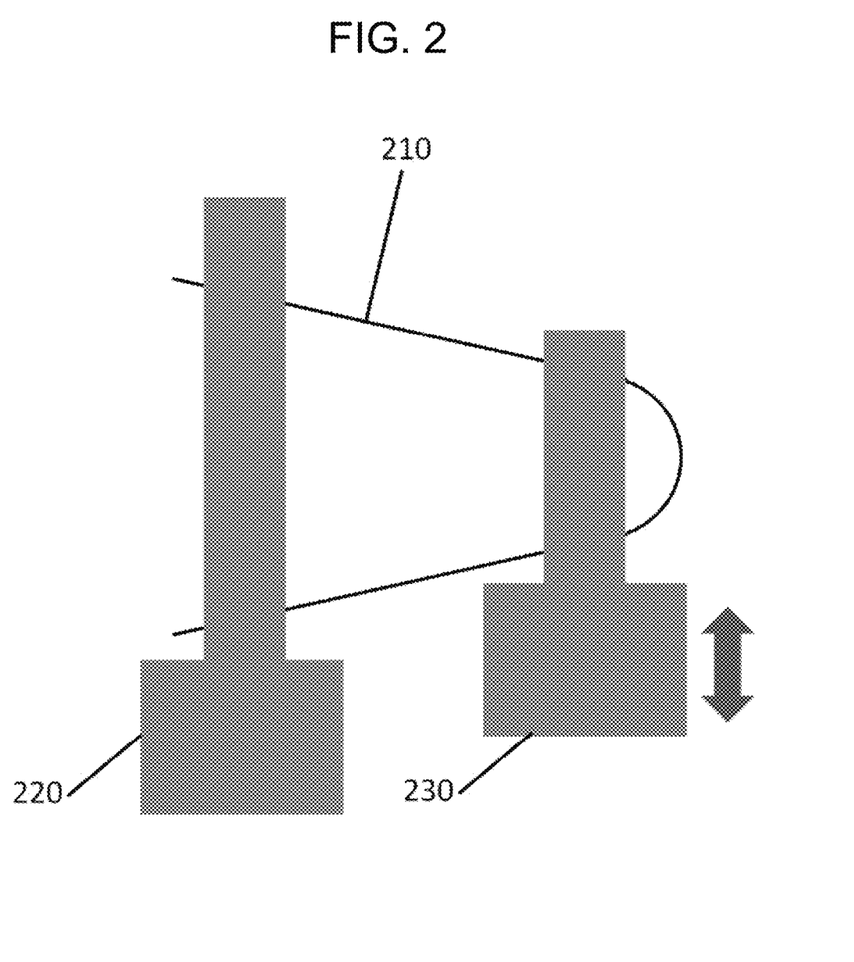
FIG. 2 is a schematic view showing an aspect of manufacturing the emitter of the present invention.

FIG. 2 is a schematic view showing an aspect of manufacturing the emitter of the present invention.

In the emitter 100 of the present invention, the end of the tapered cathode material 210 may be bent downward or upward with respect to the plane thereof in a range of greater than 5° and less than or equal to 70° to form the cathode holder 110, and then the above needle-like substance 120 may be fixed to the bent (i.e., curved) end 130. The tapered cathode material 210 is fixed with tweezers 220 and 230, for example, as shown in FIG. 2, and only the tweezers 230 may be moved downward or upward. Such work may be manually performed while being observed with a microscope or the like or may be set so as to be automatically performed by a machine. The needle-like substance 120 is fixed to the end 130 by a conductive adhesive sheet such as a carbon pad. The cathode material 210 is the same as the above material of the cathode holder 110, and thus the description thereof is omitted.

Embodiment 2

Embodiment 2 describes an electron gun including the emitter of the present invention.

Figure 3:
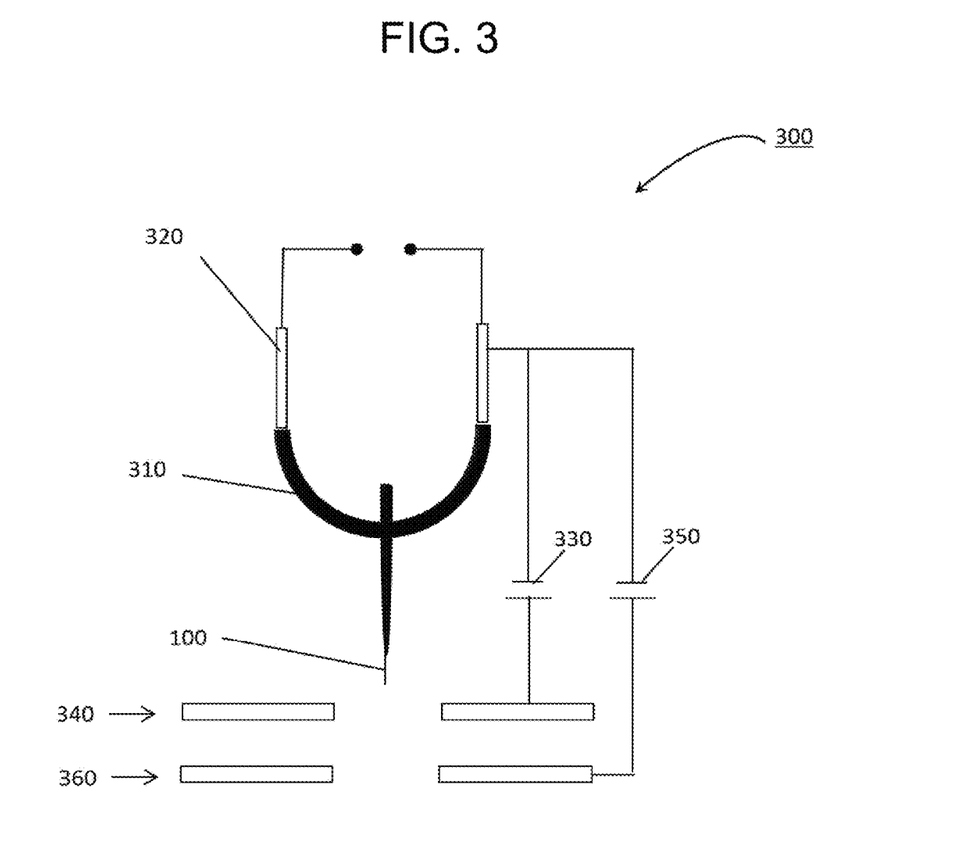
FIG. 3 is a schematic view showing an electron gun including the emitter of the present invention.

FIG. 3 is a schematic view showing an electron gun including an emitter of the present invention.

An electron gun 300 of the present invention includes at least the emitter 100 described in the Embodiment 1.

The emitter 100 is attached to a filament 310. This is preferable because the nanowire 100 is easy to handle. The filament 310 is made of any metal selected from the group consisting of tungsten (W), tantalum (Ta), platinum (Pt), rhenium (Re), and carbon (C). In FIG. 3, the filament 310 has a hairpin shape (i.e., U-shape), but the present invention is not limited to it, and the shape of the filament 310 may be any shape such as a V-shape.

In the electron gun 300, an extraction power supply 330 is connected between an electrode 320 and an extraction electrode 340, and the extraction power supply 330 applies a voltage between the emitter 100 and the extraction electrode 340. Furthermore, in the electron gun 300, an acceleration power supply 350 is connected between the electrode 320 and an acceleration electrode 360, and the acceleration power supply 350 applies a voltage between the emitter 100 and the acceleration electrode 360. The extraction electrode and the acceleration electrode may be referred to as an anode.

The electrode 320 may further be connected to a flash power supply in a case where the electron gun 300 is a cold cathode field emission electron gun or may be connected to a heating power supply in a case where the electron gun 300 is a Schottky electron gun.

The electron gun 300 may be placed under a vacuum of $10^{-8}$ Pa to $10^{-7}$ Pa. In this case, the end of the emitter 100 from which electrons are to be emitted can be kept clean.

An operation when the electron gun 300 of the present invention is a cold cathode field emission electron gun is briefly described.

The extraction power supply 330 applies a voltage between the emitter 100 and the extraction electrode 340. As a result, an electric field concentration is generated at an end of the emitter 100 through which electrons are to be emitted (corresponding to the end of the needle-like substance 120 in FIG. 1), and electrons are extracted. Furthermore, the acceleration power supply 350 applies a voltage between the emitter 100 and the acceleration electrode 360. As a result, electrons extracted at the end of the emitter 100 through which electrons are to be emitted are accelerated and emitted toward the sample. The surface of the nanowire 100 may be cleaned by appropriately performing flushing with a flash power supply connected to the electrode 320. These operations are performed under the above vacuum.

An operation when the electron gun 300 of the present invention is a Schottky electron gun is briefly described.

The heating power supply connected to the electrode 320 heats the emitter 100, and the extraction power supply 330 applies a voltage between the emitter 100 and the extraction electrode 340. As a result, Schottky emission occurs at the end of the emitter 100 through which electrons are to be emitted, and electrons are extracted. Furthermore, the acceleration power supply 350 applies a voltage between the emitter 100 and the acceleration electrode 360. As a result, electrons extracted at the end of the emitter 100 through which electrons are to be emitted are accelerated and emitted toward the sample. These operations are performed under the above vacuum. Since thermoelectrons can be emitted from the emitter 100 by the heating power supply, the electron gun 300 may further include a suppressor (not shown in the drawings) for shielding the thermoelectrons.

Since the electron gun 300 of the present invention includes the emitter 100 described in detail in the Embodiment 1, electrons are easily emitted, and the electron beam can be converged with high efficiency. Such an electron gun 300 is employed in any electronic device having electron focusing capability. For example, such an electronic device may be any one selected from the group consisting of a scanning electron microscope, a transmission electron microscope, a scanning transmission electron microscope, an Auger electron spectrometer, an electron energy loss spectrometer, and an energy dispersive electron spectrometer.

Next, the present invention is described in detail by using specific Examples, but it is to be noted that that the present invention is not limited to these Examples.

EXAMPLES

Examples/Comparative Examples: Comparative Examples 1, 3, 5, 7, and 9 and Examples 2, 4, 6, 8, and 10 to 13

In Comparative Examples 1, 3, 5, 7, and 9 and Examples 2, 4, 6, 8, and 10 to 13, using tapered tantalum as a cathode material and lanthanum hexaboride ($LaB_6$), hafnium carbide (HfC), and a carbon nanotube as needle-like substances, emitters with varying L/T (see FIG. 1) and angle α (see FIG. 1) were manufactured.

As for tantalum, a tantalum having a thickness of 2 to 5 μm at the end for fixing the needle-like substance was used. $LaB_6$ and HfC were, respectively, produced by the CVD methods disclosed in JP 2008-262794 A and WO 2016-140177 A1, for example.

The obtained nanowire was subjected to composition analysis by an energy dispersive X-ray spectrometer (EDS), and confirmed to be nanowires of $LaB_6$ and HfC. In addition, from the HTREM image and the figures of the selected area electron diffraction pattern which were obtained by transmission electron microscope, it was confirmed that both of the nanowires of $LaB_6$ and HfC are single crystal, the longitudinal direction of $LaB_6$ corresponds to the <100> crystal direction, and its end has the {100} plane, the {110} plane, and the {111} plane as well as that the longitudinal direction of HfC corresponds to the <100> crystal direction, and its end has the {111} plane and the {110} plane. The $LaB_6$ and HfC nanowires had a diameter of 10 nm to 200 nm (i.e., 10 nm or more and 200 nm or less) and a length of 1 μm to 30 μm (i.e., 1 μm or more and 30 μm or less). Hereinafter, among these, $LaB_6$ nanowires and HfC nanowires having a diameter of about 100 nm and a length of 115 μm were used.

Meanwhile, a single-walled carbon nanotube (SWCNT, manufactured by Cheap Tube) was employed as the carbon nanotube. The SWCNT had a diameter of 5 nm and a diameter of 5 μm.

Various emitters were manufactured using tweezers in the manner shown in FIG. 2 so as to satisfy the L/T and angle α (unit: °) shown in Table 1. The needle-like substance was fixed to the cathode holder with a carbon pad.

TABLE 1

List of emitter configurations of Comparative Examples 1, 3, 5, 7, and 9 and Examples 2, 4, 6, 8, and 10 to 13, shown in Examples/Comparative Examples

| Examples/Comparative Examples | Cathode material | Needle-like substance | L (unit: μm) | T (unit: μm) | L/T | α (unit: °) |
|---|---|---|---|---|---|---|
| Comparative Example 1 | Tantalum | $LaB_6$ | 3 | 2 | 1.5 | 0 |
| Example 2 | Tantalum | $LaB_6$ | 3 | 2 | 1.5 | 10 |
| Comparative Example 3 | Tantalum | $LaB_6$ | 4 | 2 | 2 | 0 |
| Example 4 | Tantalum | $LaB_6$ | 4 | 2 | 2 | 38 |
| Comparative Example 5 | Tantalum | $LaB_6$ | 2 | 4 | 0.5 | 5 |
| Example 6 | Tantalum | $LaB_6$ | 2 | 4 | 0.5 | 12 |
| Comparative Example 7 | Tantalum | $LaB_6$ | 1 | 3 | 0.3 | 0 |
| Example 8 | Tantalum | $LaB_6$ | 1 | 3 | 0.3 | 65 |
| Comparative Example 9 | Tantalum | $LaB_6$ | 1 | 5 | 0.2 | 10 |
| Example 10 | Tantalum | $LaB_6$ | 5 | 2 | 2.5 | 10 |

TABLE 1-continued

List of emitter configurations of Comparative Examples 1, 3, 5, 7, and 9 and Examples 2, 4, 6, 8, and 10 to 13, shown in Examples/Comparative Examples

| Examples/Comparative Examples | Cathode material | Needle-like substance | L (unit: μm) | T (unit: μm) | L/T | α (unit: °) |
|---|---|---|---|---|---|---|
| Example 11 | Tantalum | $LaB_6$ | 1 | 3 | 0.3 | 70 |
| Example 12 | Tantalum | CNT | 3 | 2 | 1.5 | 10 |
| Example 13 | Tantalum | HfC | 3 | 2 | 1.5 | 10 |

Figure 4:
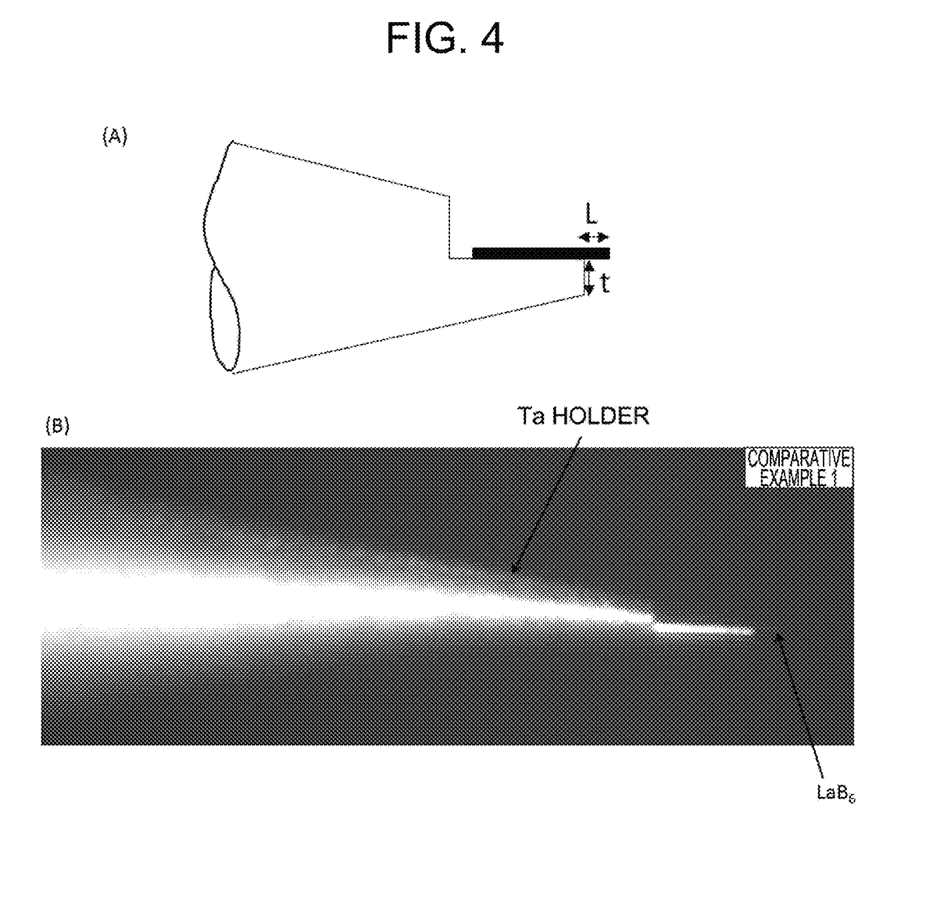
FIG. 4 is a schematic view (A) and a photograph (B) of an emitter of Comparative Example 1.

FIG. 4 is a view showing a schematic view (A) and a photograph (B) of the emitter of Comparative Example 1.

Figure 5:
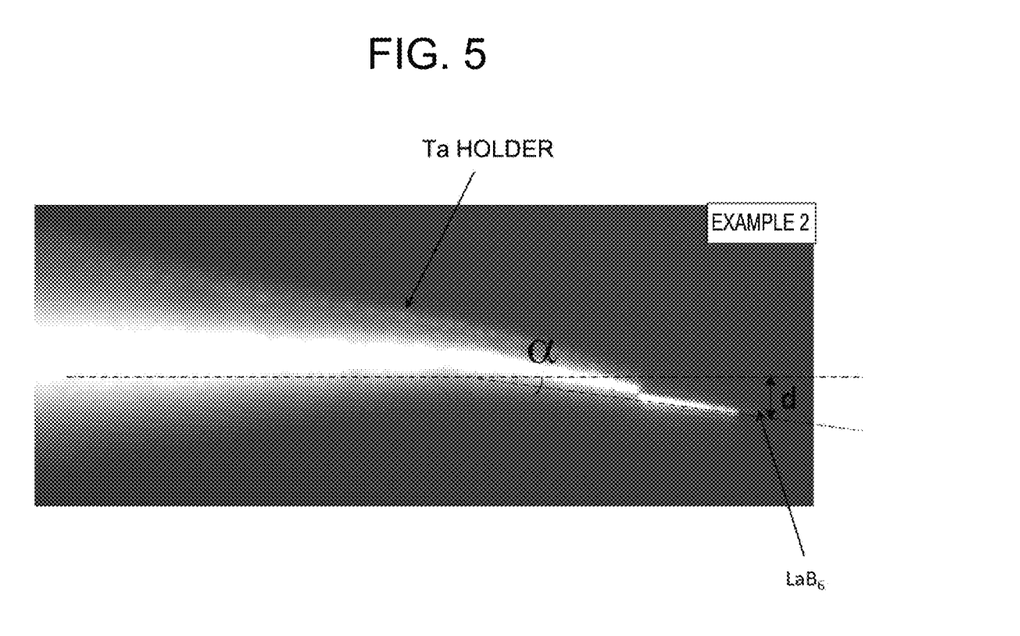
FIG. 5 is a view showing a photograph of an emitter of Example 2.

FIG. 5 is a view showing a photograph of an emitter of Example 2.

As shown in FIG. 4, when α was 0°, the cathode holder was not bent, and the longitudinal direction of the needle-like substance matched the cathode axis of the cathode holder. The emitters of Comparative Example 3 and Comparative Example 7 showed the similar aspects as well.

On the other hand, as shown in FIG. 5, when α was 10°, the cathode holder was bent, and the longitudinal direction of the needle-like substance did not match the cathode axis of the cathode holder. Example 4, Comparative Example 5, Example 6, Comparative Example 7, Example 8, Comparative Example 9, and Examples 10 to 13 of the above table showed the similar aspects as well (see Table 1).

Using the obtained emitter, an electron gun showed in FIG. 3 was constructed, an extraction voltage was set to 350 V, then an extraction voltage polarity was inverted, an acceleration voltage was set to 350 V, and an electron pattern was observed. At this time, a distance (corresponding to d in FIG. 1) between an end of the needle-like substance from which electrons are emitted and the cathode axis and an angle (corresponding to θ in FIG. 1) formed by the cathode axis and a direction in which the end of the needle-like substance emits electrons were measured. The results are shown in FIG. 6, FIG. 7, and Table 2.

Figure 6:
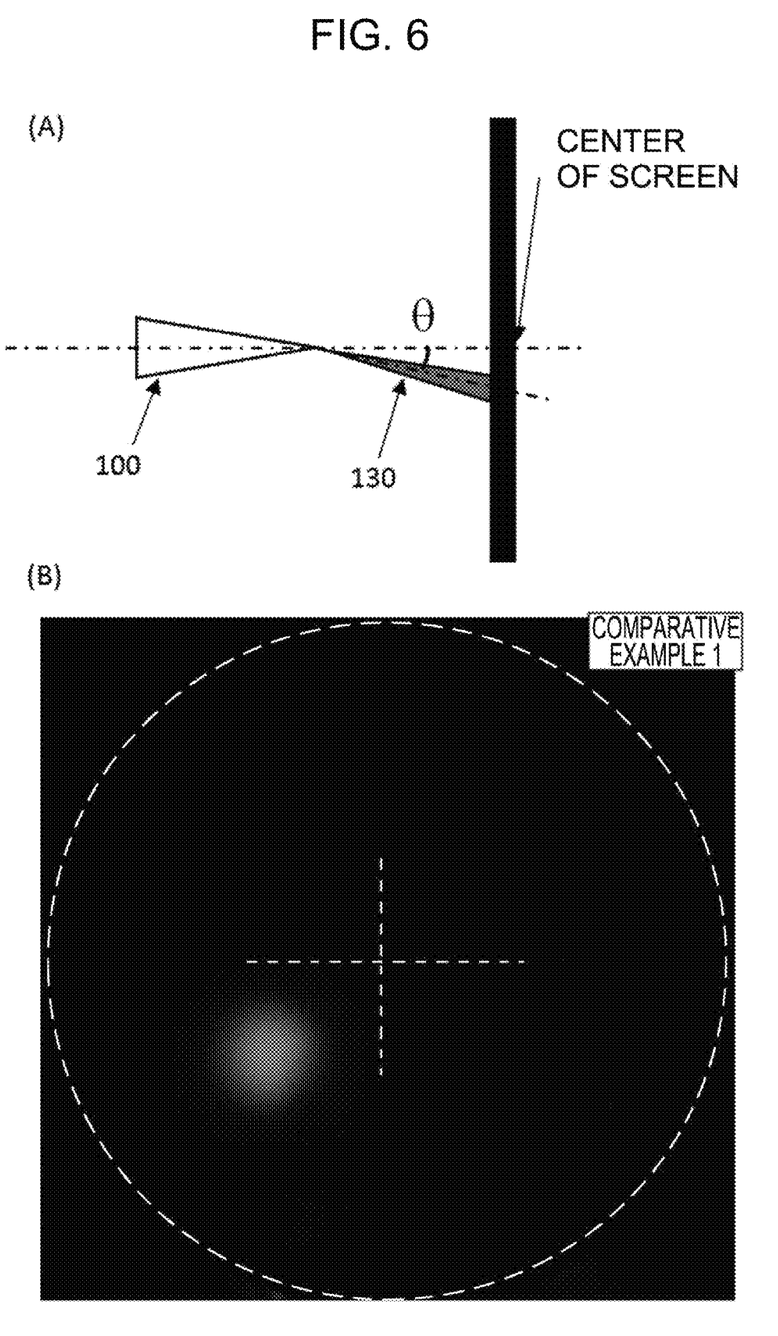
FIG. 6 is a schematic view (A) showing an aspect of observation of an electron pattern of an emitter of Comparative Example 1 and a view showing an observation result (B).

FIG. 6 is a schematic view (A) showing an aspect of observation of an electron pattern of an emitter of Comparative Example 1 and a view showing an observation result (B).

Figure 7:
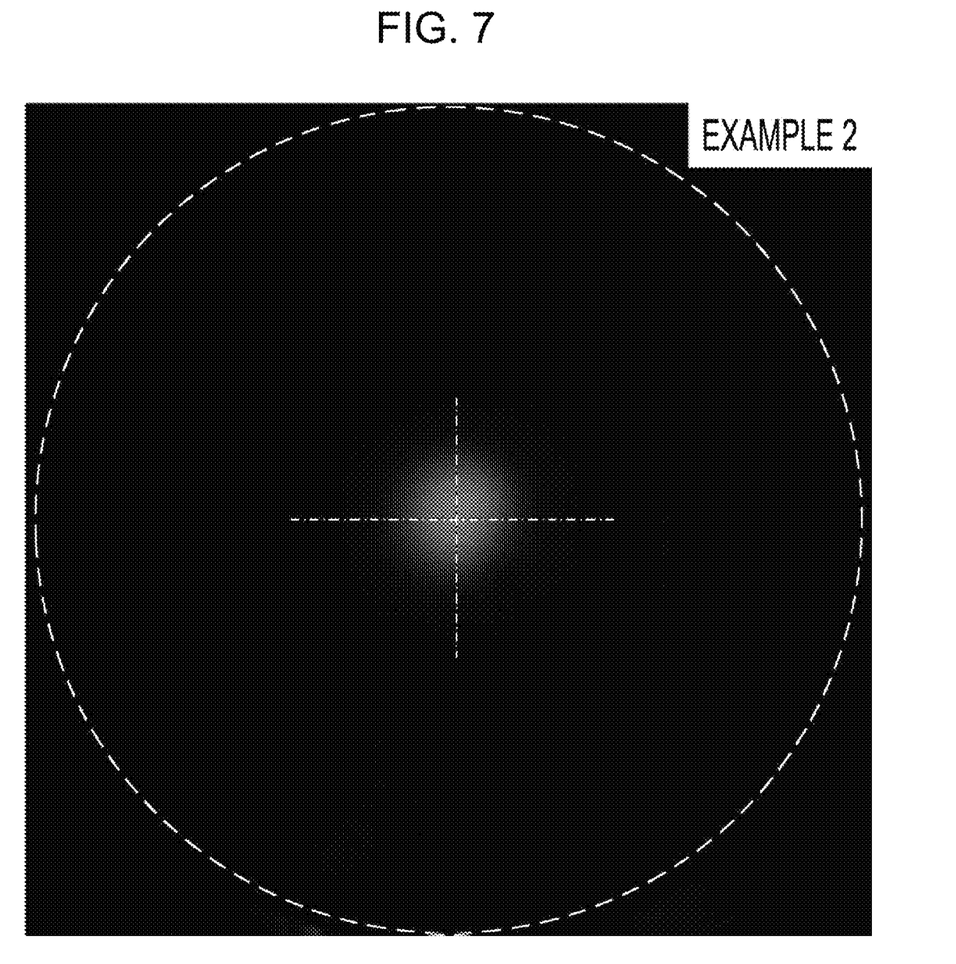
FIG. 7 is a view showing an observation result of an electron pattern of an emitter of Example 2.

FIG. 7 is a view showing an observation result of an electron pattern of an emitter of Example 2.

In FIGS. 6(B) and 7, an area brightly showed in gray scale indicates a position irradiated with the electron beam. According to FIG. 6(B), the electron pattern of the emitter of Comparative Example 1 was largely deviated from the center of the screen, and θ was calculated to be 6°. On the other hand, according to FIG. 7, the electron pattern of the emitter of Example 2 appeared at the center of the screen, and θ was 0°. Although not shown in the drawings, it was confirmed that all of the electron patterns of the emitters of Examples 4, 6, 8, and 10 to 13 appeared at the center of the screen. In the above Examples/Comparative Examples in which the end of the cathode holder is bent, the distance d (i.e., shift from cathode axis) between the end of the needle-like substance from which electrons are emitted and the cathode axis is corrected at the time of measurement. The corrected distance d (μm) is shown in Table 2.

TABLE 2

List of emitter configurations of Comparative Examples 1, 3, 5, 7, and 9 and Examples 2, 4, 6, 8, and 10 to 13, shown in Examples/Comparative Examples

| Examples/Comparative Examples | Cathode material | Needle-like substance | L/T | α (unit: °) | d (unit: μm) | θ (unit: °) |
|---|---|---|---|---|---|---|
| Comparative Example 1 | Tantalum | $LaB_6$ | 1.5 | 0 | 0 | 6 |
| Example 2 | Tantalum | $LaB_6$ | 1.5 | 10 | 6 | 0 |
| Comparative Example 3 | Tantalum | $LaB_6$ | 2 | 0 | 0 | 21 |
| Example 4 | Tantalum | $LaB_6$ | 2 | 38 | 40 | 3 |
| Comparative Example 5 | Tantalum | $LaB_6$ | 0.5 | 5 | 1 | 4 |
| Example 6 | Tantalum | $LaB_6$ | 0.5 | 12 | 7 | 0 |
| Comparative Example 7 | Tantalum | $LaB_6$ | 0.3 | 0 | 0 | 20 |
| Example 8 | Tantalum | $LaB_6$ | 0.3 | 65 | 36 | 2 |
| Comparative Example 9 | Tantalum | $LaB_6$ | 0.2 | 10 | 4 | 22 |
| Example 10 | Tantalum | $LaB_6$ | 2.5 | 10 | 6 | 2 |
| Example 11 | Tantalum | $LaB_6$ | 0.3 | 70 | 20 | 1 |
| Example 12 | Tantalum | CNT | 1.5 | 10 | 6 | 0 |
| Example 13 | Tantalum | HfC | 1.5 | 10 | 6 | 0 |

Table 2 shows that when the angle α (unit: °) satisfies 5°<α≤70° and the relation L/T satisfies 0.3≤L/T≤2.5, the electron beam emitted from the emitter is substantially parallel to the cathode axis. Furthermore, it was shown that when the angle α (unit: °) satisfies 10°≤α≤40° and the relation L/T satisfies 0.5≤L/T≤2.5, the electron beam emitted from the emitter has a small shift from the cathode axis and is substantially parallel to the cathode axis. Furthermore, when the angle α (unit: °) satisfies 10°≤α≤15°, the electron beam becomes parallel to the cathode axis, and the shift (d: μm) from the cathode axis can also be suppressed to 6 μm≤d≤10 μm.

INDUSTRIAL APPLICABILITY

Since the emitter of the present invention can efficiently emit focused electrons, the emitter of the present invention is employed in any device having electron focusing capability, such as a scanning electron microscope, a transmission electron microscope, a scanning transmission electron microscope, an Auger electron spectrometer, an electron energy loss spectrometer, and an energy dispersive electron spectrometer.

REFERENCE SIGNS LIST

100 Emitter
110 Cathode holder
120 Needle-like substance
130 End of cathode holder 110 to which needle-like substance 120 is fixed
140 Electron
210 Tapered cathode material
220, 230 Tweezers
300 Electron gun
310 Filament
320 Electrode
330 Extraction power supply
340 Extraction electrode
350 Acceleration power supply
360 Acceleration electrode

The invention claimed is:

1. An emitter comprising a cathode holder and a needle-like substance fixed to an end of the cathode holder, wherein:
the end of the cathode holder to which the needle-like substance is fixed is bent at an angle α (wherein α (unit: °) satisfies 5°<α≤70°) formed with respect to a cathode axis which is a longitudinal direction of the cathode holder;
the needle-like substance is a single crystal nanowire or a nanotube; and
a relation L/T between a thickness T (unit: μm) of the end of the cathode holder and a length L (unit: μm) by which the needle-like substance protrudes from the end of the cathode holder satisfies 0.3≤L/T≤2.5.

2. The emitter according to claim 1, wherein:
the angle α (unit: °) satisfies 10°≤α≤40°; and
the relation L/T satisfies 0.5≤L/T≤2.5.

3. The emitter according to claim 2, wherein the angle α (unit: °) satisfies 10°≤α≤15°.

4. The emitter according to claim 1, wherein an angle θ (unit: °) formed by a direction of the cathode axis and a direction in which the end of the needle-like substance emits electrons satisfies 0°≤θ<4°.

5. The emitter according to claim 4, wherein the angle θ (unit: °) satisfies 0°≤θ≤3°.

6. The emitter according to claim 1, wherein the needle-like substance has a diameter in a range of 1 nm or more and 200 nm or less and a length in a range of 500 nm or more and 30 μm or less.

7. The emitter of claim 1, wherein the single crystal nanowire is made of any one selected from the group consisting of a rare earth boride, a metal carbide, and a metal oxide.

8. The emitter according to claim 7, wherein:
the single crystal nanowire is the rare earth boride that is LaB$_6$; and
a longitudinal direction of the single crystal nanowire corresponds to a <100> crystal direction; and
an end of the single crystal nanowire through which electrons are to be emitted has at least a {100} plane, a {110} plane, and a {111} plane.

9. The emitter according to claim 7, wherein:
the single crystal nanowire is a metal carbide that is HfC, and
a longitudinal direction of the single crystal nanowire corresponds to the <100> crystal direction, and
an end of the single crystal nanowire through which electrons are to be emitted has at least a {111} plane and a {110} plane.

10. The emitter of claim 1, wherein the nanotube is any one selected from the group consisting of a carbon nanotube, a boron nitride nanotube, and a boron carbonitride nanotube.

11. The emitter according to claim 1, wherein a distanced (unit: μm) between the cathode axis and the end of the needle-like substance that emits electrons satisfies 5 μm≤d≤50 μm.

12. The emitter according to claim 11, wherein the distance d (unit: μm) satisfies 6 μm≤d≤40 μm.

13. The emitter according to claim 1, wherein the end of the needle-like substance that emits electrons has a tapered shape.

14. The emitter according to claim 1, wherein the cathode holder is made of any metal selected from tantalum (Ta), tungsten (W), and rhenium (Re).

15. An electron gun comprising:
an electrode;
a filament connected to the electrode; and
the emitter according to claim 1 attached to the filament.

16. The electron gun according to claim 15, wherein the filament is made of a metal selected from the group consisting of tungsten (W), tantalum (Ta), platinum (Pt), rhenium (Re), and carbon (C).

17. The electron gun according to claim 15, wherein the electron gun is a cold cathode field emission electron gun or a Schottky electron gun.

18. An electronic device comprising an electron gun, wherein the electron gun is the electron gun according to claim 15.

19. The electronic device according to claim 18, wherein the electronic device is any one selected from the group consisting of a scanning electron microscope, a transmission electron microscope, a scanning transmission electron microscope, an Auger electron spectrometer, an electron energy loss spectrometer, and an energy dispersive electron spectrometer.

* * * * *